United States Patent
Wei (10) Patent No.: US 7,963,035 B2
(45) Date of Patent: Jun. 21, 2011

(54) MANUFACTURING METHOD FOR A RADIATOR AND A STRUCTURE THEREOF

(75) Inventor: Wen-Chen Wei, Taipei Hsien (TW)

(73) Assignee: Neg Tyi Precision Co., Ltd., Taipei Hsien (TW)

(*) Notice: Subject to any disclaimer, the term of this patent is extended or adjusted under 35 U.S.C. 154(b) by 546 days.

(21) Appl. No.: 12/076,132

(22) Filed: Mar. 14, 2008

(65) Prior Publication Data
US 2009/0178795 A1    Jul. 16, 2009

(30) Foreign Application Priority Data
Jan. 16, 2008  (TW) .............................. 97101657 A (51) Int. Cl.
*B21D 53/02* (2006.01)

(52) U.S. Cl. ........... 29/890.03; 29/890.039; 29/890.048; 165/185; 165/80.3

(58) Field of Classification Search .............. 165/185, 165/80.3; 29/890.03, 890.039, 890.048
See application file for complete search history.

(56) References Cited

U.S. PATENT DOCUMENTS

| | | | | |
|---|---|---|---|---|
| 3,148,441 A * | 9/1964 | Schuler | .................... | 29/890.048 |
| 3,216,496 A * | 11/1965 | Katz | ............................. | 165/185 |
| 3,305,013 A * | 2/1967 | Friedl et al. | ................... | 165/183 |
| 5,014,776 A * | 5/1991 | Hess | .............................. | 165/185 |
| 5,638,715 A * | 6/1997 | Lipinski | ........................... | 72/178 |
| 5,867,904 A * | 2/1999 | Harris et al. | ............. | 29/890.046 |
| 6,386,275 B1 * | 5/2002 | Kuo et al. | ..................... | 165/80.3 |
| 6,633,484 B1 * | 10/2003 | Lee et al. | ....................... | 361/697 |
| 6,742,581 B2 * | 6/2004 | Mochizuki et al. | .......... | 165/185 |
| 6,748,656 B2 * | 6/2004 | Woerner et al. | ............ | 29/890.03 |
| 6,758,262 B2 * | 7/2004 | Kawabata et al. | ........... | 165/80.3 |
| 7,028,757 B1 * | 4/2006 | Hegde | ....................... | 165/104.21 |
| D579,420 S * | 10/2008 | Chu | .............................. | D13/179 |
| 2004/0118552 A1 * | 6/2004 | Huang et al. | ................. | 165/80.3 |
| 2005/0211416 A1 * | 9/2005 | Kawabata et al. | ........... | 165/80.3 |
| 2006/0060332 A1 * | 3/2006 | Wang et al. | ............. | 165/104.33 |
| 2007/0084595 A1 * | 4/2007 | Lin et al. | ....................... | 165/185 |
| 2007/0277958 A1 * | 12/2007 | Huang | ........................ | 165/80.3 |

* cited by examiner

*Primary Examiner* — David P Bryant
*Assistant Examiner* — Jacob J Cigna
(74) *Attorney, Agent, or Firm* — Rosenberg, Klein & Lee (57) ABSTRACT

A manufacturing method for a radiator and a structure thereof are disclosed. The manufacturing method for a radiator includes the following steps. A substrate and a plurality of cooling sheets are provided. The side wall of the substrate has a plurality of concave troughs. The cooling sheets are respectively plugged into the concave troughs. The two side walls of each of the concave troughs tightly contact the two opposing surfaces of the cooling sheet. Thereby, each of the cooling sheets is located at the side wall of the substrate, and the top portion and the bottom portion of the cooling sheet extend to outside of the top surface and the bottom surface of the substrate. By using the riveting technology to directly fasten the cooling sheets via the two side walls of the concave troughs, the present invention prevents the heat-conduction loss from being occurred.

4 Claims, 9 Drawing Sheets

FIG. 1
PRIOR ART

```
┌─────────────────────────┐
│ Provide a substrate, the substrate has a top surface, │
│ a bottom surface and a side wall, and the side wall │
│ of the substrate has a plurality of concave troughs │
└─────────────────────────┘
              ↓
┌─────────────────────────┐
│ Provide a plurality of cooling sheets, the cooling │
│ sheets are respectively plugged into the concave │
│ troughs of the substrate, and each of the cooling │
│ sheets has a top portion and a bottom portion │
└─────────────────────────┘
              ↓
┌─────────────────────────┐
│ Using the riveting technology to press the substrate │
│ so that the two side walls of each of the concave │
│ troughs tightly contact the two opposing surfaces of │
│ the cooling sheet, and the top portion and the bottom │
│ portion of the cooling sheet extend to outside of the │
│ top surface and the bottom surface of the substrate │
└─────────────────────────┘
```

MANUFACTURING METHOD FOR A RADIATOR AND A STRUCTURE THEREOF

BACKGROUND OF THE INVENTION

1. Field of the Invention

The present invention relates to a manufacturing method for a radiator and a structure thereof. In particular, this invention relates to a manufacturing method for a radiator and a structure thereof that uses the riveting technology, without using the welding process.

2. Description of the Related Art

Figure 1:
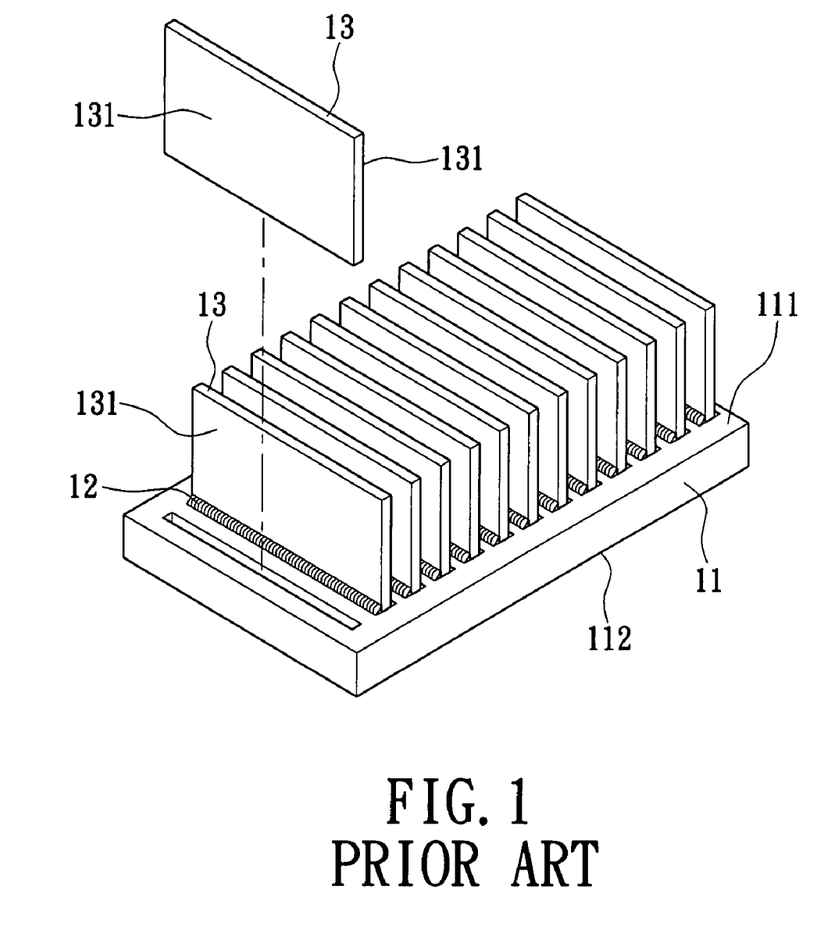
FIG. 1 is a perspective view of the radiator of the prior art.
Figure 2:
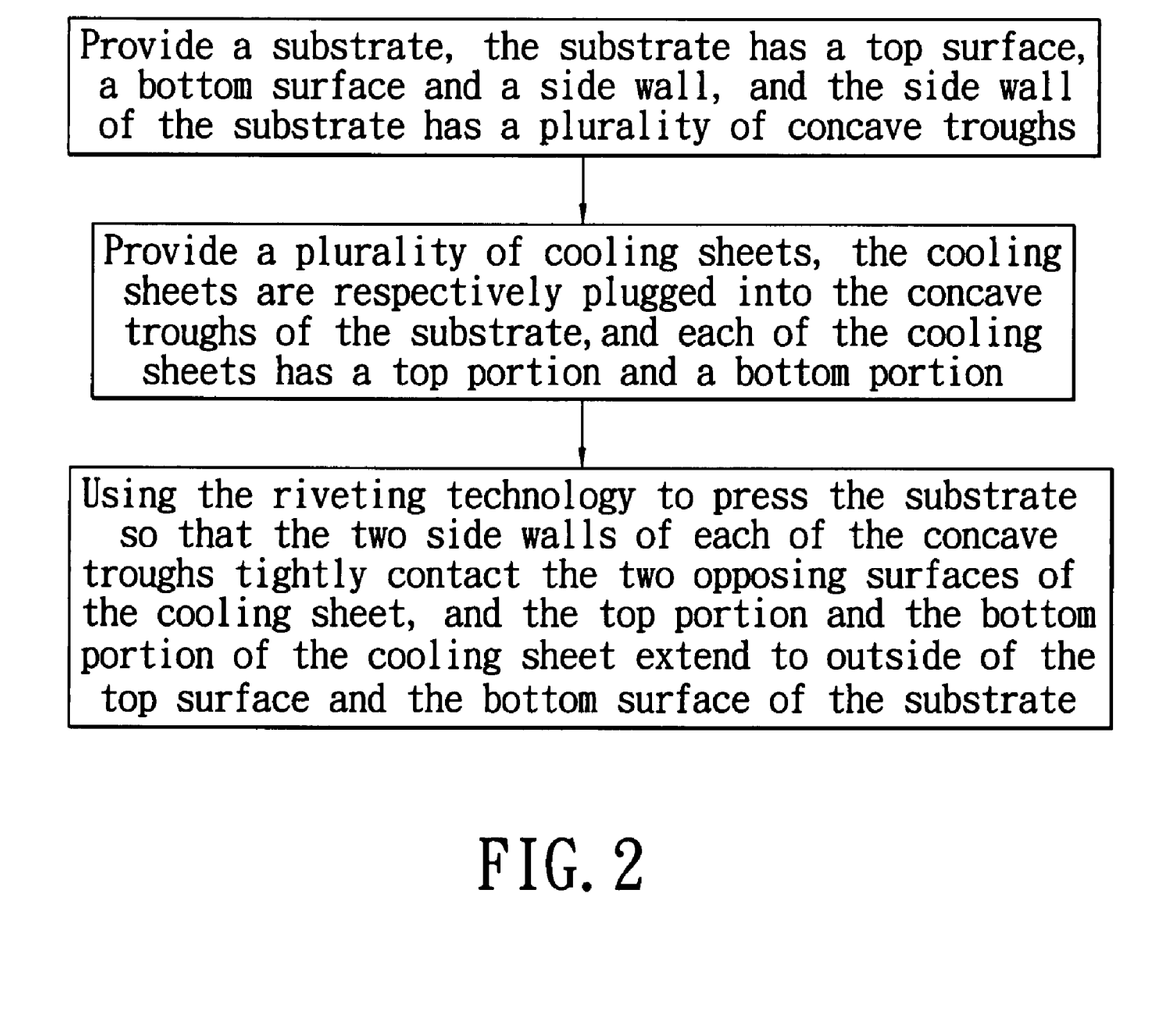
FIG. 2 is a flow chart of the manufacturing method for a radiator of the present invention.
Figure 3:
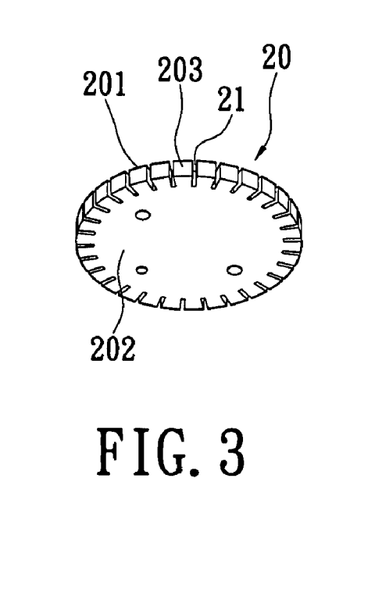
FIG. 3 is a top view of the substrate of the present invention.
Figure 4:
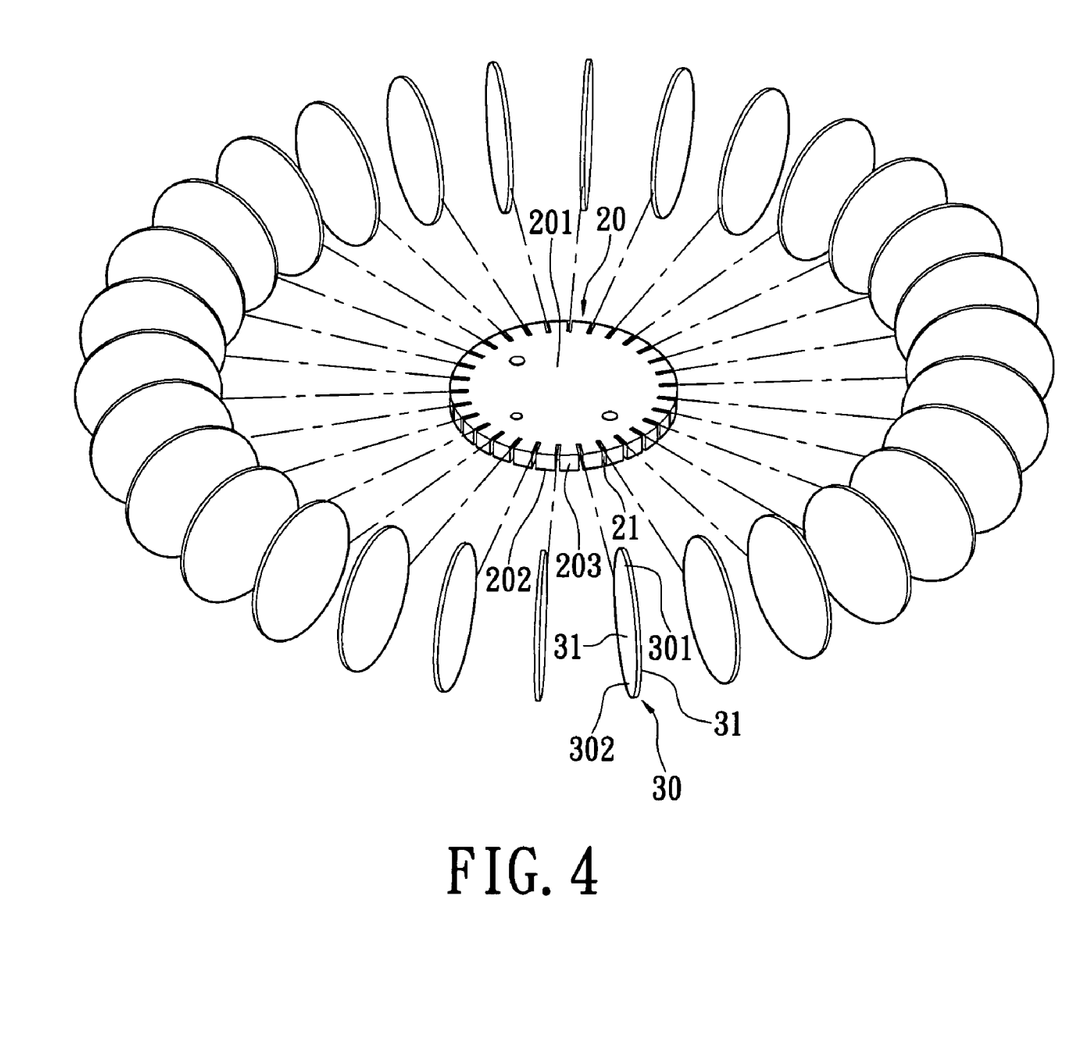
FIG. 4 is an exploded perspective view of the substrate and the cooling sheets of the present invention.
Figure 5:
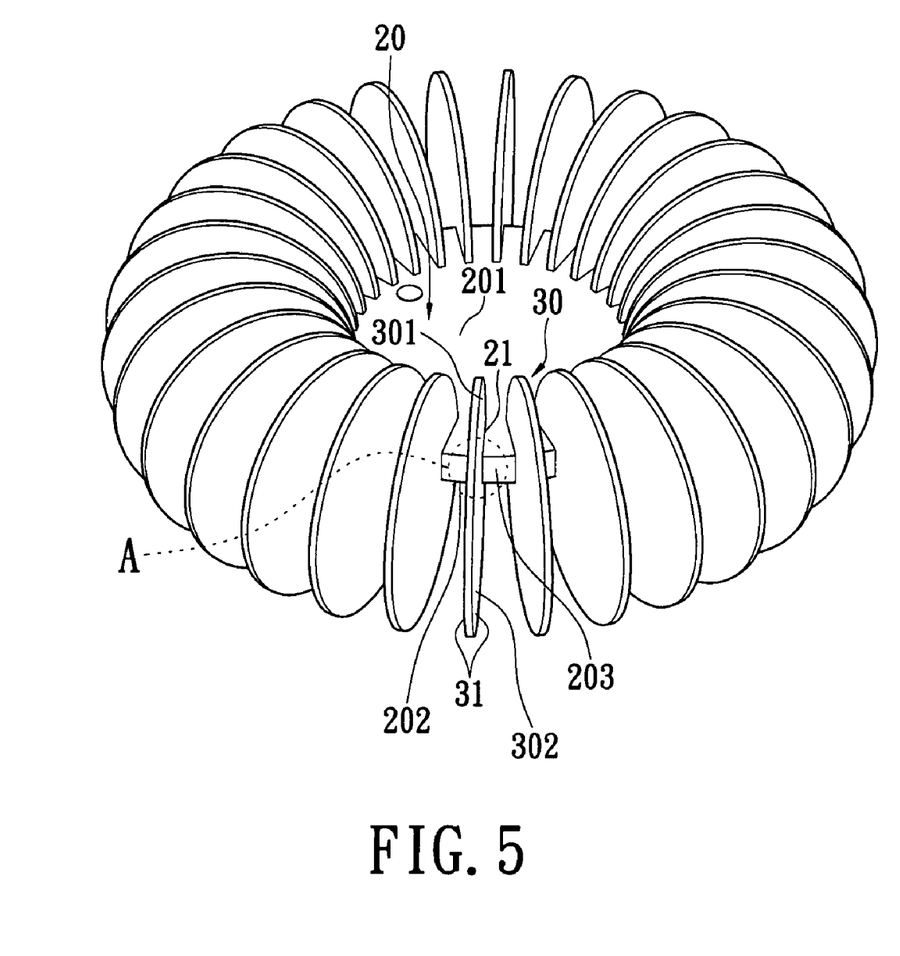
FIG. 5 is an assembly perspective view of the substrate and the cooling sheets of the present invention.
Figure 6:
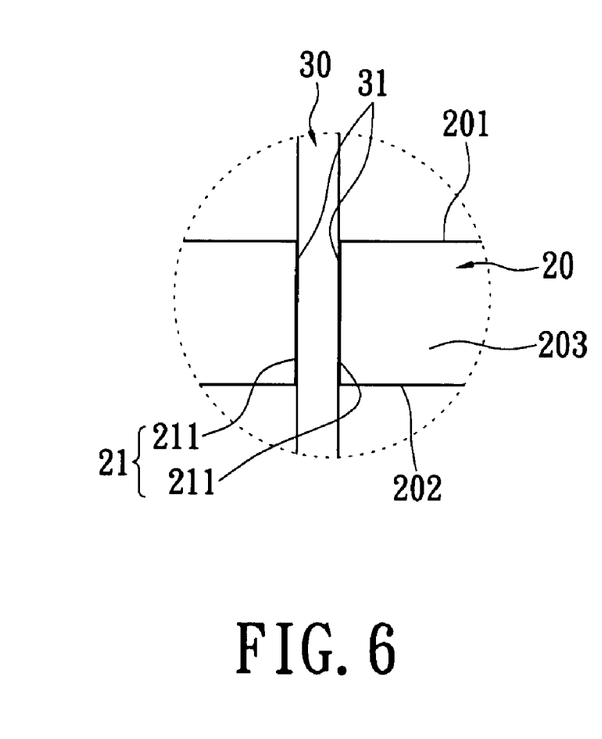
FIG. 6 is a front view of part A in FIG. 5.

The radiator is popularly applied to a variety of devices having a heat source, including electronic elements (such as CPU), and lamps (such as halogens lamp or LED lamp) to exhaust the heat. The radiator with cooling fins is the most popular one. FIG. 1 shows a radiator of the prior art. It uses the welding method to weld a plurality of cooling fins 13 that are disposed at equal distance in parallel on the top surface 111 of the base 11 via the welding material 12.

The function of the cooling fins 13 is to increase the cooling area. By contacting the bottom surface 112 of the base 11 with the heat source, the base absorbs the heat and rapidly conducts the heat to the surface 131 of the cooling fins 13. Thereby, the heat is exhausted.

Because the cooling fins 13 is welded on the top surface 111 of the base 11 via the solder 12 and the heat-conducting coefficient of the solder 12 is different from the heat-conducting coefficient of the base 11 and the cooling fins 13, heat-conduction loss occurs due to the solder 12 when the heat is conducted to the cooling fins 13. Therefore, the heat-conduction effect becomes worse.

SUMMARY OF THE INVENTION

One particular aspect of the present invention is to provide a manufacturing method for a radiator and a structure thereof without using the solder that can prevent the heat-conduction loss from being occurred and achieve the cooling effect for the electronic elements.

The manufacturing method for a radiator includes the following steps:

A substrate is provided. The substrate has a top surface, a bottom surface and a side wall. The side wall of the substrate has a plurality of concave troughs that pass through the top surface and the bottom surface.

A plurality of cooling sheets is provided. The cooling sheets are respectively plugged into the concave troughs of the substrate. Each of the cooling sheets has a top portion and a bottom portion.

By using the riveting technology to press the substrate, the two side walls of each of the concave troughs tightly contact the two opposing surfaces of the cooling sheet. Thereby, each of the cooling sheets is located at the side wall of the substrate, and the top portion and the bottom portion of the cooling sheet extend to outside of the top surface and the bottom surface of the substrate.

The present invention also provides a radiator structure. The radiator structure includes a substrate and a plurality of cooling sheets. The substrate has a top surface, a bottom surface and a side wall. The side wall of the substrate has a plurality of concave troughs that pass through the top surface and the bottom surface.

The cooling sheets are respectively plugged into the concave troughs of the substrate. Each of the cooling sheets has a top portion and a bottom portion. The two side walls of each of the concave troughs of the substrate tightly contact the two opposing surfaces of the cooling sheet. The top portion and the bottom portion of each of the cooling sheets extend to outside of the top surface and the bottom surface of the substrate.

The present invention has the following characteristics. The present invention plugs the cooling sheets into the concave troughs of the substrate and uses the riveting technology to directly fasten the cooling sheets via the two side walls of the concave troughs. Comparing to the prior art that uses the welding method to fasten the cooling fins, the present invention does not need the solder and can prevent the heat-conduction loss from being occurred. The manufacturing process is simple.

Furthermore, because the top surface or the bottom surface can contact the heat source, such as electronic elements, and the top portion and the bottom portion of each of the cooling sheets extend to outside of the top surface and the bottom surface of the substrate, the air flow can be guided into/from the top surface and the bottom surface of the substrate in two directions. Therefore, the cooling effect for the electronic elements is enhanced.

For further understanding of the invention, reference is made to the following detailed description illustrating the embodiments and examples of the invention. The description is for illustrative purpose only and is not intended to limit the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Reference is made to FIGS. 2~6, which shows a manufacturing method for a radiator and a structure thereof of the present invention. The manufacturing method for a radiator includes the following steps:

(1) A board-shaped substrate 20, such as a heat sink plate, is provided. The substrate 20 has a top surface 201, a bottom surface 202 and a side wall 203. The side wall 203 of the substrate 20 ahs a plurality of concave troughs 21 that pass through the top surface 201 and the bottom surface 202.

(2) A plurality of cooling sheets 30 and respectively plugged into the concave troughs 21 of the substrate 20. Each of the cooling sheets 30 has a top portion 301 and a bottom portion 302.

(3) By using the riveting technology to press the substrate 20, the two side walls 211 of each of the concave troughs 21 tightly contact the two opposing surfaces 31 of the cooling sheet 30. Thereby, each of the cooling sheets 30 is located at the side wall 203 of the substrate 20, and the top portion 301 and the bottom portion 302 of the cooling sheet 30 extend to outside of the top surface 201 and the bottom surface 202 of the substrate 20. A radiator is manufactured.

Figure 7:
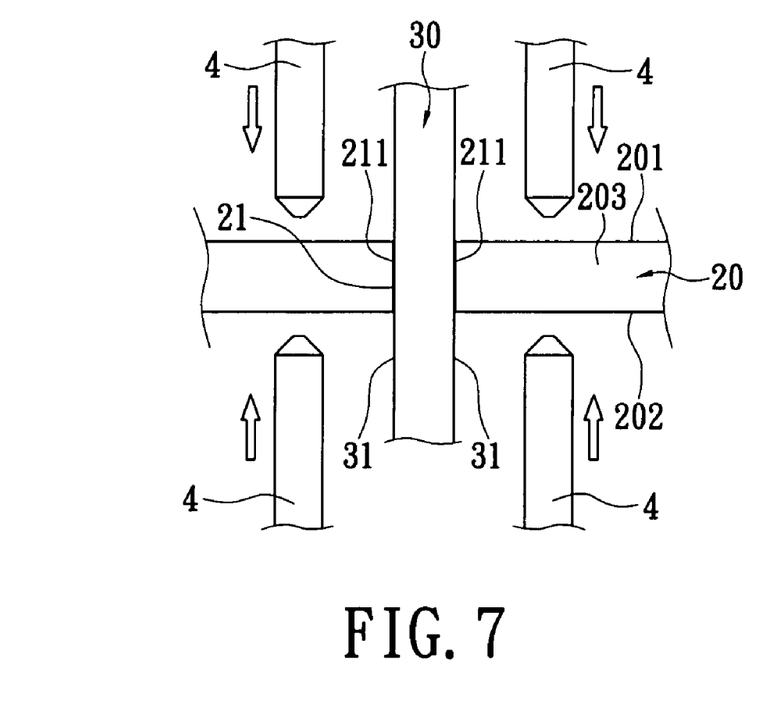
FIG. 7 is a schematic diagram of a polarity of knife-edges pressing the substrate to make the substrate be plastically deformed of an embodiment of the present invention.

Reference is made to FIG. 7. The riveting technology means that a plurality of knife-edges 4 press the top surface 201 and the bottom surface 202 of the substrate 20 that correspond to two sides of the concave trough 21 in two directions to make the substrate 20 be plastically deformed. Thereby, two side walls 211 of the concave trough 21 tightly contact the two surfaces 31 of the cooling sheet 30.

Figure 8:
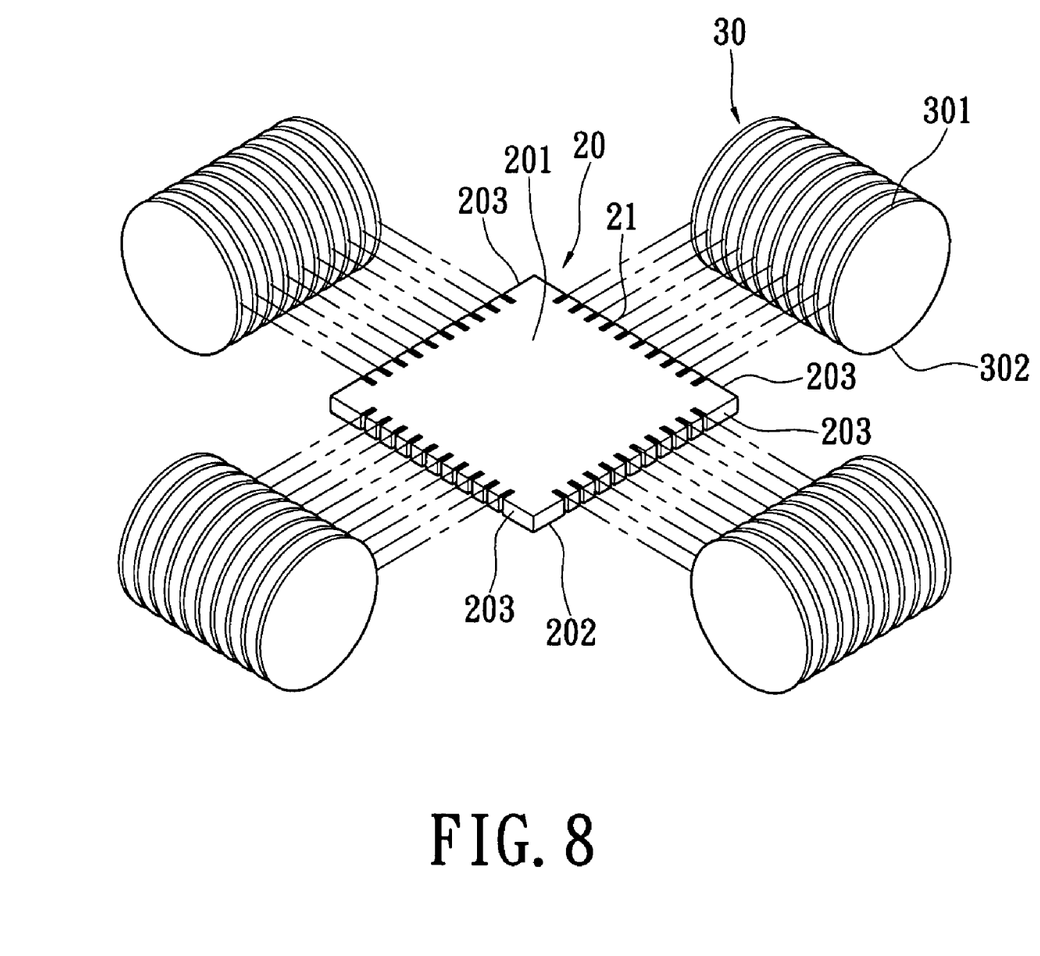
FIG. 8 is an exploded perspective view of the substrate of another embodiment and the cooling sheets of the present invention.

Furthermore, the substrate 20 in step (1) can be a circular board (such as FIG. 4) or a polygonal board (such as FIG. 8). In a preferred embodiment, the substrate 20 can be a circular board. Therefore, the cooling sheets 30 in step (2) can be automatically plugged, and can be mass produced. Alternatively, the cooling sheets 30 can be manually plugged into the substrate 20. Of course, the cooling sheets 30 can be plugged into the substrate 20 in an automation way, and the radiator can be rapidly produced.

Moreover, the cooling sheet 30 in step (2) can be a circular board (such as FIG. 4) or a polygonal board (such as FIG. 10), but not is limited to above. The substrate 20 and cooling sheet 30 can be made of the same material with high heat conductivity, such as cooper or aluminum, etc.

Figure 9:
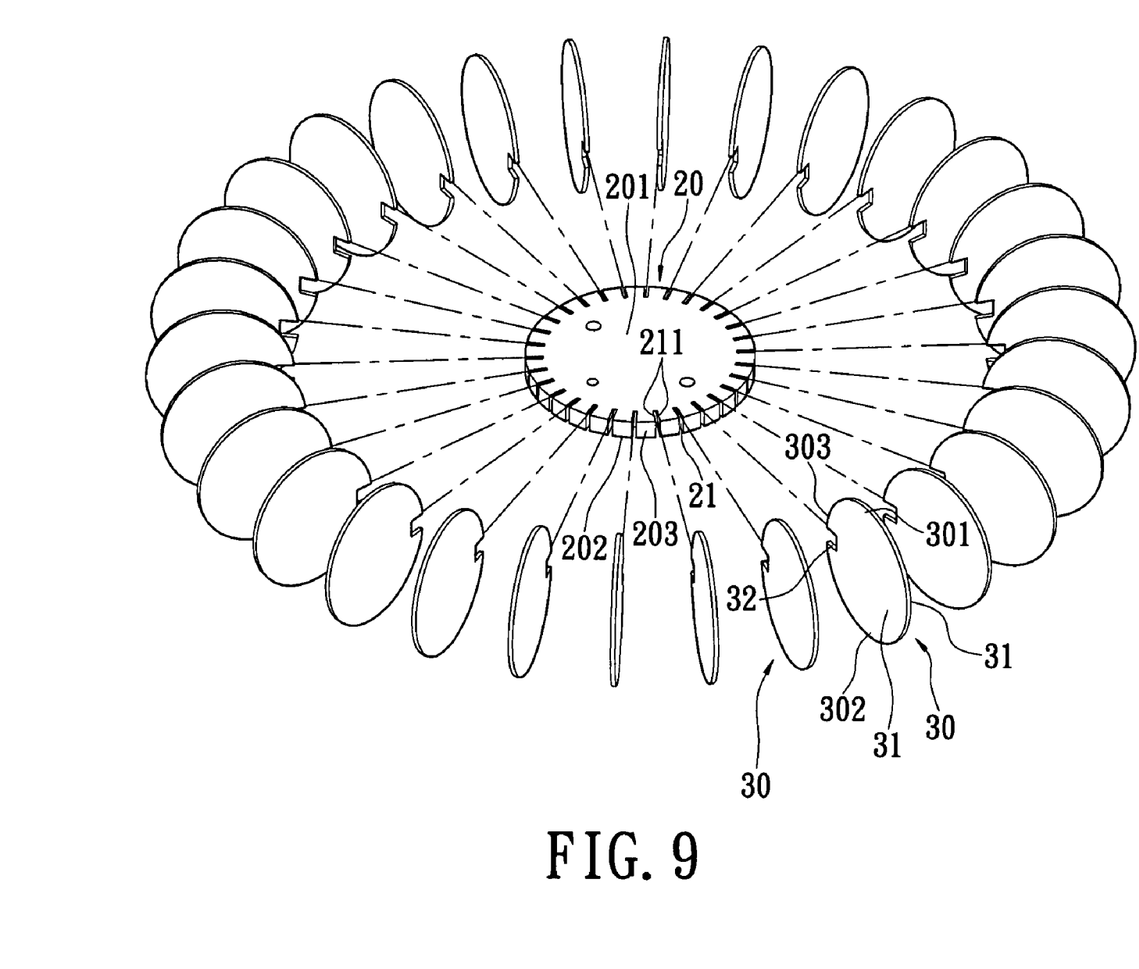
FIG. 9 is another exploded perspective view of the substrate and the cooling sheets of the present invention

As shown in FIG. 9, in this embodiment, the side edge 303 of the cooling sheet 30 further has a position-limited concave portion 32 that passes through the two surfaces 31 of the cooling sheet 30. When the cooling sheet 30 is plugged into the concave through 21 of the substrate 20, the position-limited concave portion 32 of the cooling sheet 30 is wedged with the top surface 201 of the substrate 20 so that the cooling sheets 30 are orderly plugged on the substrate 20.

Figure 10:
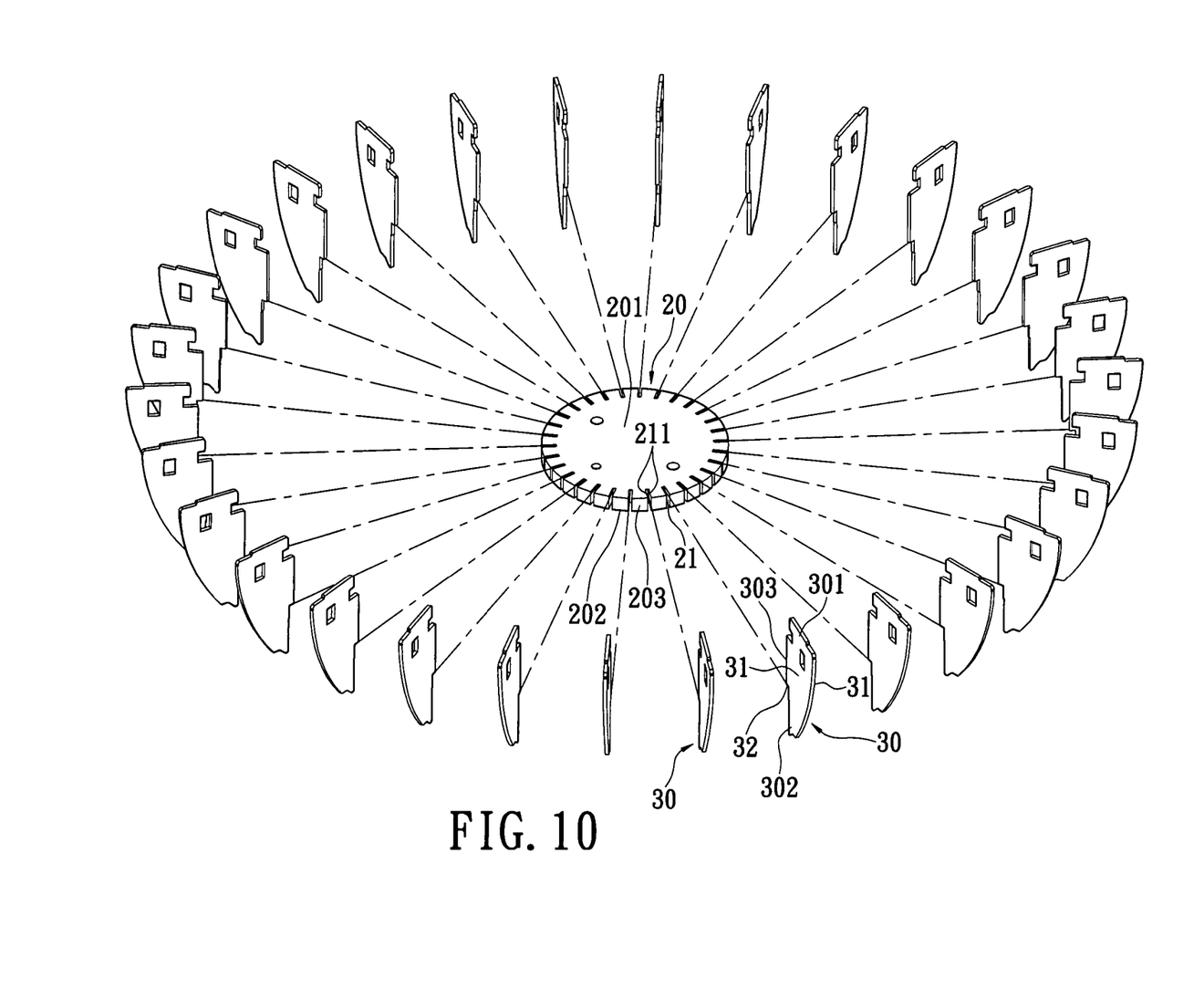
FIG. 10 is an exploded perspective view of the substrate and the cooling sheets of another embodiment of the present invention.
Figure 11:
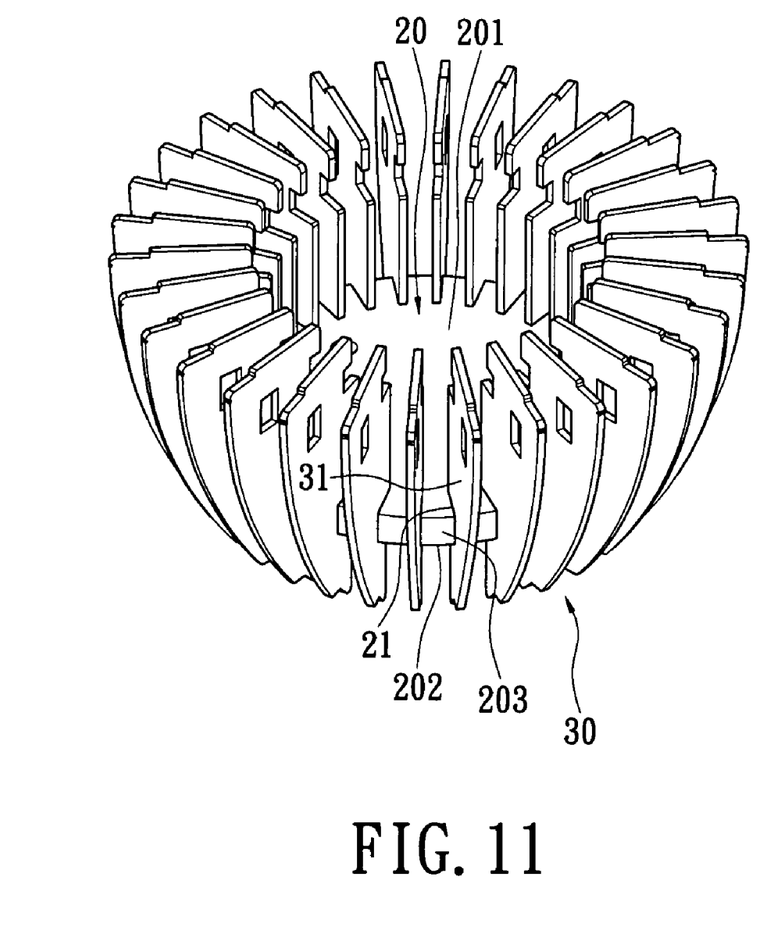
FIG. 11 is an assembly perspective view of the substrate and the cooling sheets of another embodiment of the present invention.

As shown in FIG. 9, the position-limited concave portion 32 is a concave opening that can wedged with the top surface 201 and the bottom surface 202 of the substrate 20. Alternatively, as shown in FIG. 10 or FIG. 11, the position-limited concave portion 32 is an inverse-L concave wall that is wedged with the top surface 201 of the substrate 20.

According to the above description, the radiator structure includes a substrate 20 and a plurality of cooling sheets 30. The concave troughs 21 of the substrate 20 are used for being plugged with the cooling sheets 30. The two side walls 211 of the concave trough 21 of the substrate 20 tightly contact the two surfaces 31 of the cooling sheet 30 to fasten the cooling sheet 30. The top portion 301 and the bottom portion 302 of each of the cooling sheets 30 extend to outside of the top surface 201 and the bottom surface 202 of the substrate 20.

The cooling sheet 30 and the substrate 20 press the substrate 20 by using the riveting technology so that the two side walls 211 of the concave trough 21 tightly contact the two opposing surfaces 31 of the cooling sheet 30. The riveting technology has been described as above, and is not repeated again. Furthermore, the cooling sheet 30 further includes a position-limited concave portion 32.

The present invention plugs the cooling sheets 30 into the concave troughs 21 of the substrate 20 and uses the riveting technology to directly fasten the cooling sheets 30 via the two side walls 211 of the concave troughs 20. Comparing to the prior art that uses the welding method to fasten the cooling fins, the present invention does not need the solder and can prevent the heat-conduction loss from being occurred. The manufacturing process is simple. At the same time, without using the solder, the environment protection effect is achieved (the solder usually contain lead, or the cost of the lead-free solder is high).

Furthermore, because the top surface 201 or the bottom surface 202 of the substrate 20 can contact the heat source, (such as LED), and the top portion 301 and the bottom portion 302 of each of the cooling sheets 30 extend to outside of the top surface 201 and the bottom surface 202 of the substrate 20, the cooling air flow or the heat air flow can be guided into/from the top surface 201 and the bottom surface 202 of the substrate 20 in two directions. Therefore, the cooling effect for the electronic elements is enhanced.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A manufacturing method for a radiator, comprising:
providing a heat sink plate having a top surface, a bottom surface, and at least one edge, wherein the edge of the heat sink plate has a plurality of radially arranged concave troughs disposed thereon and joining the top and the bottom surfaces;
disposing a plurality of cooling fins correspondingly into the concave troughs on the edge of the heat sink plate, each cooling fin having a top portion and a bottom portion; and
concurrently pressing the top and the bottom surfaces of the heat sink plate at the proximity of the concave troughs for causing partial deforming of the heat sink plate, thereby fixing the cooling fins in the concave troughs of the heat sink plate at the edge thereof, wherein the top portion and the bottom portion of the cooling fins extend to the outside of the top surface and the bottom surface of the heat sink plate.

2. The method of claim 1, wherein the heat sink plate is a circular board or a polygonal board.

3. The method of claim 1, wherein the side edge of each cooling fin has a position-limiting concave portion, and the position-limiting concave portion of each cooling fin is engage-able with the concave trough of the heat sink plate.

4. The method of claim 1, wherein the pressing step includes a plurality of knife-edges concurrently pressing the top surface and the bottom surface of the heat sink plate at the proximity of the concave troughs.

* * * * *

UNITED STATES PATENT AND TRADEMARK OFFICE
CERTIFICATE OF CORRECTION

PATENT NO. : 7,963,035 B2  
APPLICATION NO. : 12/076132  
DATED : June 21, 2011  
INVENTOR(S) : Wen-Chen Wei Page 1 of 1

It is certified that error appears in the above-identified patent and that said Letters Patent is hereby corrected as shown below:

IN THE TITLE PAGE: BLOCK [73]: DELETE THE ASSIGNEE NAME "NEG TYI PRECISION CO., LTD." AND INSERT THE NAME --NENG TYI PRECISION INDUSTRIES CO., LTD.--

Signed and Sealed this  
Sixteenth Day of August, 2011

David J. Kappos  
*Director of the United States Patent and Trademark Office*